(12) United States Patent
Hsu et al.

(10) Patent No.: US 7,192,792 B2
(45) Date of Patent: Mar. 20, 2007

(54) METHOD OF CHANGING AN ELECTRICALLY PROGRAMMABLE RESISTANCE CROSS POINT MEMORY BIT

(75) Inventors: Sheng Teng Hsu, Camas, WA (US); Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 179 days.

(21) Appl. No.: 11/066,592

(22) Filed: Feb. 24, 2005

(65) Prior Publication Data

US 2006/0094187 A1 May 4, 2006

Related U.S. Application Data

(62) Division of application No. 10/345,547, filed on Jan. 15, 2003, now Pat. No. 6,861,687, which is a division of application No. 09/894,922, filed on Jun. 28, 2001, now Pat. No. 6,531,371.

(51) Int. Cl.
*H01L 21/66* (2006.01)
*H01L 31/111* (2006.01)

(52) U.S. Cl. .......................... 438/17; 257/169

(58) Field of Classification Search ................ 257/169, 257/236, 300, 331, 334, 536; 438/10, 17
See application file for complete search history.

(56) References Cited

U.S. PATENT DOCUMENTS

| 5,018,102 A | * | 5/1991 | Houston ...................... 365/156 |
| 6,204,139 B1 | * | 3/2001 | Liu et al. ..................... 438/385 |
| 6,535,026 B2 | * | 3/2003 | Chung et al. ................. 327/51 |

* cited by examiner

*Primary Examiner*—Calvin Lee
(74) *Attorney, Agent, or Firm*—David C. Ripma

(57) ABSTRACT

Resistive cross point memory devices are provided, along with methods of manufacture and use, including a method of changing an electrically programmable resistance cross point memory bit. The memory device comprises an active layer of perovskite material interposed between upper electrodes and lower electrodes. A bit region located within the active layer at the cross point of an upper electrode and a lower electrode has a resistivity that can change through a range of values in response to application of one, or more voltage pulses. Voltage pulses may be used to increase the resistivity of the bit region, decrease the resistivity of the bit region, or determine the resistivity of the bit region. Memory circuits are provided to aid in the programming and read out of the bit region.

11 Claims, 3 Drawing Sheets

METHOD OF CHANGING AN ELECTRICALLY PROGRAMMABLE RESISTANCE CROSS POINT MEMORY BIT

CROSS-REFERENCE

This application is a Divisional of U.S. patent application Ser. No. 10/345,547, filed on Jan. 15, 2003, issued as U.S. Pat. No. 6,861,687 and entitled Electrically Programmable Resistance Cross Point Memory Structure, which is a Divisional of U.S. patent application Ser. No. 09/894,922, filed on Jun. 28, 2001, issued as U.S. Pat. No. 6,531,371 and entitled Electrically Programmable Resistance Cross Point Memory, which is incorporated herein by reference.

BACKGROUND OF THE INVENTION

This invention relates to nonvolatile memory, and more particularly to a cross point structure utilizing electric pulse induced resistance change effects in magnetoresistive films.

Materials having a perovskite structure, among them colossal magnetoresistance (CMR) materials and high temperature superconductivity (HTSC) materials are materials that have electrical resistance characteristics that can be changed by external influences.

For instance, the properties of materials having perovskite structures, especially for CMR and HTSC materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity from those used to induce the initial change.

SUMMARY OF THE INVENTION

Accordingly, a memory structure is provided, which comprises a substrate, a plurality of bottom electrodes overlying the substrate, a plurality of top electrodes overlying the bottom electrodes, and a continuous active layer interposed between the plurality of top electrodes and the plurality of bottom electrodes. The plurality of top electrodes and the plurality of bottom electrodes form a cross point memory structures. A region of the active layer located at each cross point acts as a variable resistor. Each region serves as a bit within the memory structure.

The resistivity of a bit within the memory structure can be changed by a method comprising the following steps. Providing the bit formed at the cross point of a word line and a bit line with a perovskite active layer interposed between the word line and the bit line. The bit line is connected through a bit pass transistor having a bit gate, to a load transistor, having a load gate, connected to ground. By applying a programming voltage to the word line, and a first on voltage to the bit gate, current is allowed to flow through the bit pass transistor. By applying another on voltage to the load gate, current is allowed to flow through the load transistor. This allows the current to flow through the active layer to change the resistivity of the bit. Depending on the polarity of the programming voltage, the resistivity of the bit can be increased or decreased. The on voltages applied to the bit gate and the load gate will be different for different polarities of programming voltage.

The value of a bit can be determined by providing the bit formed at the cross point of a word line and a bit line with a perovskite active layer interposed between the word line and the bit line. The bit line is connected through a bit pass transistor, having a bit gate, to an inverter, with a load transistor, having a load gate, connected between the inverter and ground. Applying a load voltage to the load gate sets a threshold, whereby current above a saturation current of the load transistor is allowed to flow through the load transistor, and current below the saturation current will not flow through the load transistor. Applying an on voltage to the bit gate selects the bit pass transistor, which determines the bit to be read. Applying a readout voltage to the word line causes current to flow through the bit corresponding to the cross point of the word line and the bit line, which has been selected by applying an on voltage at the bit gate. The current flows through the bit pass transistor. If the current exceeds the saturation current of the load transistor, current will pass through the load transistor and the inverter will produce an output voltage of approximately zero volts. If the current is less than the saturation current, the current will not flow through the load transistor and the output voltage will be equal to an operation voltage of the inverter.

DETAILED DESCRIPTION OF THE INVENTION

Figure 1:
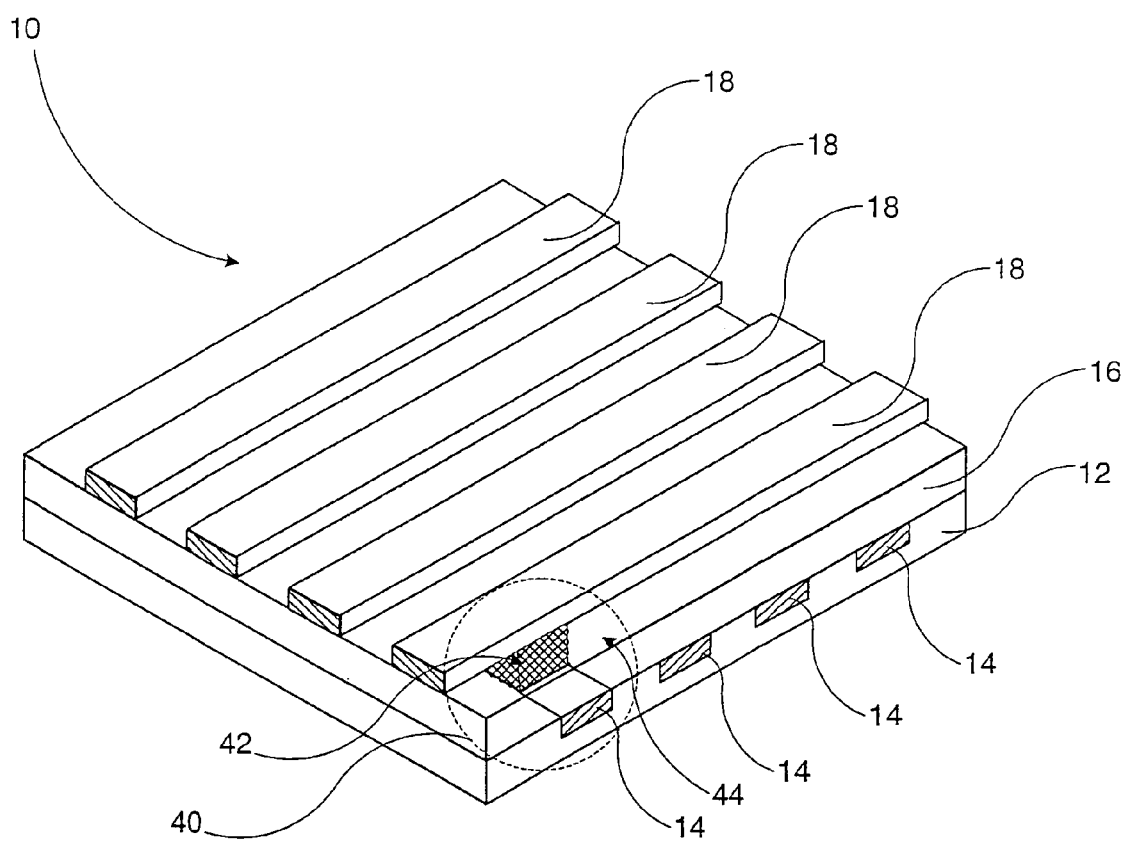
FIG. 1 is an isometric view of a cross point memory array area.

FIG. 1 shows a cross point memory array area 10. The memory array area 10 comprises a substrate 12 with a plurality of bottom electrodes 14 formed thereon. An active layer 16 has been deposited overlying the plurality of bottom electrodes 14. A plurality of top electrodes 18 overly the active layer 16, such that the active layer 16 is interposed between the bottom electrodes 14 and the top electrodes 18.

The top electrodes 18 and the bottom electrodes 14 are each preferably substantially parallel rows. The top electrodes 18 and the bottom electrodes 14 are arranged in a cross point arrangement such that they cross each other in a regular pattern. A cross point refers to each position where a top electrode crosses a bottom electrode. As shown, the top electrodes and the bottom electrodes are arranged at substantially 90 degrees with respect to each other. The top electrodes and the bottom electrodes can each function as either word lines or bit lines as part of a cross point memory array.

FIG. 1 shows just the memory array area. It should be clear that in an actual device, the substrate 12, the bottom electrodes 14 and the top electrodes 18 may extend well beyond the memory array area, which is defined by the active layer 16. The active layer is substantially continuous, such that the active layer extends across more than one cross point.

The substrate 12 is any suitable substrate material, whether amorphous, polycrystalline or crystalline, such as $LaAlO_3$, Si, TiN or other material.

The bottom electrodes 14 are made of conductive oxide or other conductive material. In a preferred embodiment, the conductive material is a material, such as $YBa_2Cu_3O_7$ (YBCO), that allows the epitaxial growth of an overlying perovskite material. In another preferred embodiment, the conductive material is platinum. The bottom electrodes are a thickness in the range of between about 5 nm and about 500 nm. In a preferred embodiment, the bottom electrodes 14 are formed by forming a trench, depositing the conductive material and polishing the conductive material until level with the substrate. The polishing can be accomplished using chemical mechanical polishing (CMP) or other suitable means. Alternatively, the bottom electrodes may be deposited and patterned without first forming a trench and without polishing.

The active layer 16 is a material capable of having its resistivity changed in response to an electrical signal. The active material is preferably a perovskite material, such as a colossal magnetoresistive (CMR) material or a high temperature superconducting (HTSC) material, for example $Pr_{0.7}Ca_{0.3}MnO_3$ (PCMO). Another example of a suitable material is $Gd_{0.7}Ca_{0.3}BaCo_2O_{5+\delta}$. The active layer is preferably between about 5 nm and 500 nm thick. The active layer 16 can be deposited using any suitable deposition technique including pulsed laser deposition, rf-sputtering, e-beam evaporation, thermal evaporation, metal organic deposition, sol gel deposition, and metal organic chemical vapor deposition. The active layer is removed from outside the memory array area by ion milling or other suitable process. It is also possible to form a large recessed area to deposit perovskite material over and then use chemical mechanical polishing (CMP) to form an active layer 16.

The top electrodes 18 comprise a conductive material, preferably platinum, copper, silver, or gold.

Figure 2:
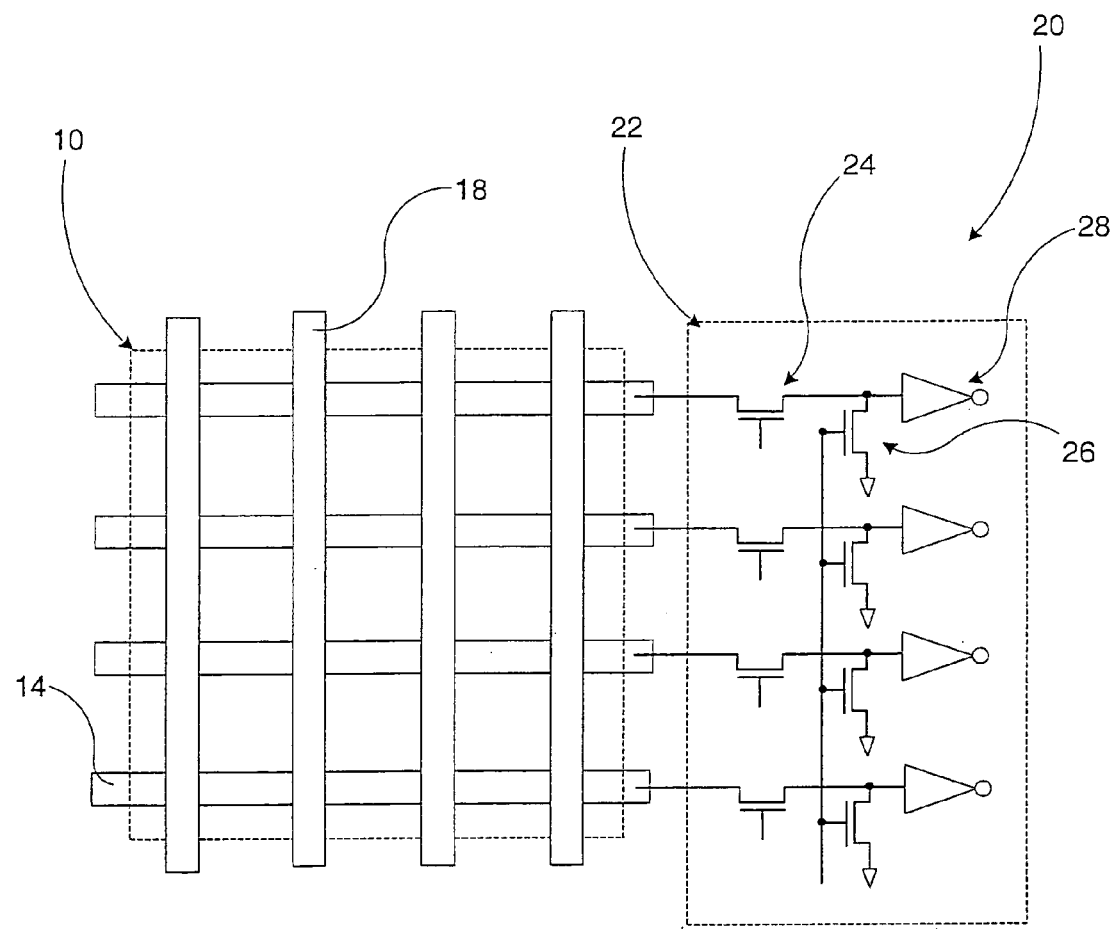
FIG. 2 is a schematic view of a memory readout circuit connected to a cross point memory array area.

Referring now to FIG. 2, a memory device 20 comprising the memory array area 10 connected to a memory circuit 22 is shown. The memory circuit 22 comprises at least one bit pass transistor 24 connected to at least one load transistor 26 and at least one inverter 28. These structures are shown schematically, as the formation of the individual semiconductor elements are well known.

In a preferred embodiment of a method of making the memory device 20, one, or more, of transistor structures, interconnects or other components of the memory circuit 22 may be formed prior to the formation of the memory array area 10. By forming components of the memory circuit 22 prior to the memory array area 10, possible degradation of the active layer due to subsequent processing is reduced, or eliminated.

Referring again to FIG. 1, the active layer is shown with a region 40 (shown by a dashed circle) to illustrate the region as transparent for illustration purposes. A bit region 42 is shown. The bit region 42 is a portion of the active layer 16 interposed between the bottom electrodes 14 and the top electrodes 18 such that an electrical signal passing between the top and bottom electrodes passes primarily through the bit region. Each bit region corresponds to a cross point. Under normal operation, the bit region 42 is formed in the active layer by having its resistivity changed in response to an electrical signal. A bulk region 44 of the active layer 16 is contiguous with the bit region 42. That portion of the active layer 16 that is not changed by an electrical signal during normal operation forms the bulk region 44. The bit region 42 acts as a variable resistor that can be changed between at least two resistivity values. Changes to the resistivity of the bit region 42 are preferably reversible. The reversibility of the resistivity change may incorporate some hysteresis. For some applications, such as write once read many (WORM) the resistivity change need not be reversible at all.

For example, if the bit region 42 has a cross sectional area of one micrometer by one micrometer and the active layer is YBCO deposited to a thickness of 60 nm, the high resistance state is approximately 170 MΩ and the low resistance state is approximately 10 MΩ. For a low voltage memory device, if the bit region 42 is biased to 1 volt, the current through the bit will be approximately 6 nA for the high resistance state and approximately 100 nA for the low resistance state. This example has been provided for illustration purposes only. The resistance values will change depending upon the active layer thickness and material, as well as the cross sectional area of the bit itself. The voltage applied across the bit will further affect the current through the bit.

Figure 3:
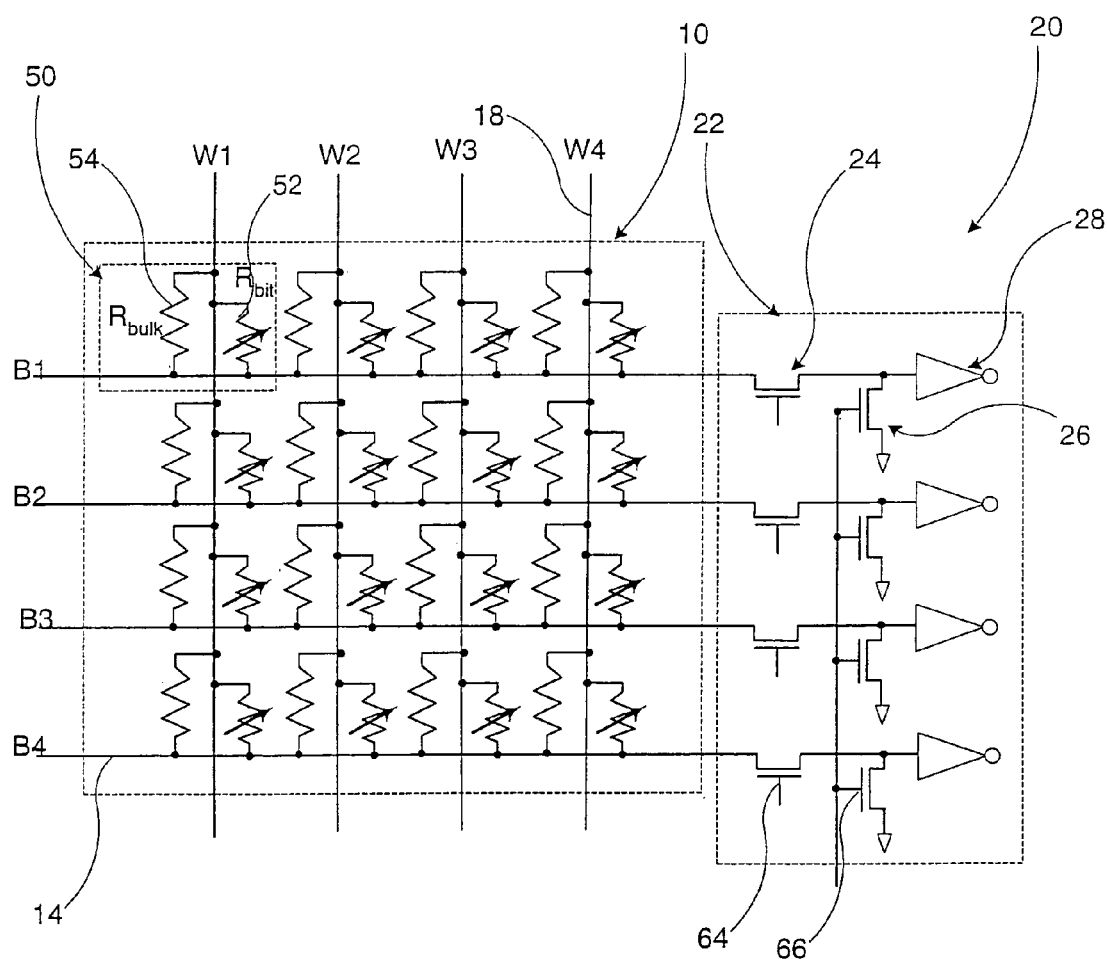
FIG. 3 is a schematic view of a cross point memory device with readout circuit.

FIG. 3 shows a schematic diagram of a 16 bit, 4×4-memory array, memory block 20. The memory block 20 comprises the memory array area 10 connected to the memory circuit 22. In this schematic view the active layer is shown as being an array of resistors connected between the lower electrodes 14, which are also designated as bit lines B1 through B4, and the upper electrodes 18, which are also designated as word lines W1 through W4. Alternatively, the lower electrodes could be the word lines and the upper electrodes could be the bit lines. The bit lines are connected to the memory circuit 22. As shown, the lower electrodes are bit lines, so the lower electrodes are connected to the memory circuit 22.

Looking at the memory array area 10, each bit 50 can be treated as comprising primarily a bit resistor 52 with an accompanying bulk resistor 54 in parallel. This array does not require a gated transistor for each bit. There is also no need for a separate capacitor as any data value is stored using a changing resistance of each bit resistor 52. The total resistance of each bit is going to be controlled primarily by the bit resistor 52, which acts as a variable resistor. The bit resistor 52 has a resistance that can be changed between at least two values in response to an electrical signal, including a high resistance state and a low resistance state. Preferably, the bulk resistor 54 will have a higher resistance than the bit resistor 52, especially when the bit resistor is in a low resistance state.

Referring now to the memory circuit 22, each bit line is connected to the bit pass transistor 24. The bit pass transistor 24 has a bit pass gate 64. The bit pass gate 64 contributes to determining which bit is being programmed or read out. The bit pass transistor is connected to the load transistor 26, which has a load gate 66, and the inverter 28. The load transistor is used to determine which memory block is being programmed or read out. The inverter is used in combination with the load transistor to set the output between two voltage levels, so that a binary state can be read out.

Referring again to the memory array area, the active layer will preferably have a higher resistivity than the resistivity of the low resistance state of the bit region, which corresponds to the bit resistor 52. If necessary, the resistivity of the active layer can be increase by applying one or more electrical pulses to the active layer during manufacturing.

Once a device is completed and in operation, it can be programmed and read. It may also be desirable to set all of the bit resistors 52, especially those along a single word line, to the same resistance level either high resistance or low resistance. This may be used to produce a word erase or a block erase. For example, if n-channel transistors are used for the pass transistor and the load transistor, applying a negative voltage, or a plurality of negative voltage pulses, to a word line (e.g. W1) and grounding the bit pass gate 64 and the load transistor gate 66 of the memory block 20, sets all bit resistors 52 at the cross point of the word line to the same resistance state, either high resistance or low resistance. It would also be possible to use positive voltages at the word line, provided the bit pass gate and the load gate are properly biased to allow current to flow through the bit.

In another embodiment, p-channel transistors may be used for the bit pass transistor and the load transistor. In which case a positive voltage could be applied to the word line while grounding the bit pass gate and the load gate. A negative voltage pulse may be used provided that a sufficiently negative voltage is applied to the bit pass gate and the load gate to allow current to flow through the bit.

The applied voltage, or the plurality of voltage pulses, is preferably at a level that will not damage the active layer material. Preferably, all bit resistors 52 at the cross point of the word line will be set to the high resistance level. If a single pulse is not sufficient to change the resistivity of the bit region, multiple voltage pulses, at a level lower than the level at which the active layer would be damaged, can be used to affect the change without damaging the active layer. By repeating the process with the remaining word lines, the entire memory block can be set to the same state.

The bit 50 can be programmed by applying an on voltage to the bit pass gate 64, applying a second on voltage to the load gate 66, and applying at least one programming voltage pulse to the word line. The voltage pulse applied to the word line is the opposite polarity to the polarity used for the word, or block, erase, such that the resistivity of the bit resistor 52 is changed to the opposite resistivity state. If n-channel transistors are used as described above in one embodiment, the programming pulse will be positive and the resistance of the bit resistor 52 will preferably change from a high resistance state to a low resistance state.

The bit pass gate 64 of any unselected bits and the load transistor gate 66 of any unselected memory blocks 20 are connected to ground. Any voltage at the cross point of the word line and bit line will be very small, such that no significant change in resistance will occur at unselected bits.

As discussed above, the polarity and the voltage applied at the word line, the bit pass gate, and the load gate can be selected depending on whether n-channel or p-channel transistors are used to obtain the desired behavior of the memory circuit.

The bit 50 can be read. A load voltage is applied to the load gate 66. The load voltage is smaller than the threshold voltage of the load transistor 26. In addition, at this load voltage the saturation current of the load transistor 26 is larger than the current flow through the bit 50 when it is at a high resistance level. But, at this load voltage the saturation current of the load transistor 26 is lower than the current flow through the bit 50 when it is at a low resistance level. The bit pass gate 64 is held at a voltage sufficient to allow current to flow through the bit pass transistor 24, for example $V_{cc}$. A readout voltage is applied to the word line. The voltage applied to the word line is preferably a pulse with a voltage lower than the critical voltage necessary to change the resistivity of the bit resistor 52, and correspondingly the resistivity of the bit 50.

If the bit resistor 52 is at a high resistance state, the current flow through the bit 50 is smaller than the saturation current of the load transistor 26. The bit line voltage is then lower than the threshold voltage of an n-channel transistor at an input of the inverter 28. The output voltage of the inverter is then equal to approximately its power supply voltage.

If the bit resistor 52 is at a low resistance state, such that the bit 50 is at a low resistance state, a large current tends to flow through the bit 50. This large current is larger than the saturation current of the load transistor. The bit line voltage is larger than the threshold voltage of an n-channel transistor at an input of the inverter 28. The output voltage of the inverter is then equal to approximately zero volts, which corresponds to ground.

Using the example discussed above, the current through the bit is expected to be between 6 nA and 100 nA. The bias voltage applied at the load gate of the load transistor should be selected so that the saturation current of the load transistor is between 6 nA and 100 nA, for example 50 nA. If the resistance of the bit is high enough that the current through it is less than 50 nA current will not flow through the load transistor and the output of the inverter will go to the operation voltage, for example Vcc. If the resistance of the bit is low, so that more than 50 nA flow through it, the current will flow through the load transistor and the output of the inverter will go to approximately 0 volts, or ground. If it is desired to have the bit at high resistance correspond to 0 volts, and the bit at low resistance correspond to the operation voltage, an additional inverter can be added at the output of the inverter.

Although a preferred embodiment, and other embodiments have been discussed above, the coverage is not limited to these specific embodiments. Rather, the claims shall determine the scope of the invention.

What is claimed is:

1. A method of changing resistivity of a bit within a memory array comprising the steps of:
    providing the bit formed at the cross point of a word line and a bit line with a perovskite active layer interposed between the word line and the bit line; wherein the bit line is connected through a bit pass transistor having a bit pass gate, to a load transistor, having a load gate, connected to ground;
    applying a programming voltage to the word line;
    applying a first on voltage to the bit pass gate, whereby current is allowed to flow through the bit pass transistor; and
    applying a second on voltage to the load gate, whereby current is allowed to flow through the load transistor, such that current flows through the active layer to change the resistivity of the bit.

2. The method of claim 1, wherein the programming voltage comprises a plurality of voltage pulses, whereby the resistivity of the bit is changed without damaging the bit.

3. The method of claim 2, wherein the bit pass transistor is an n-channel transistor and the first on voltage is zero, the load transistor is an n-channel transistor and the second on voltage is zero, and the programming voltage is negative, such that the bit is changed to a first resistivity level.

4. The method of claim 3, wherein the first resistivity level is a high resistance state.

5. The method of claim 3, wherein the first resistivity level is a low resistance state.

6. The method of claim 2, wherein the bit pass transistor is an n-channel transistor and the first on voltage is at a bit pass transistor threshold voltage, the load transistor is an n-channel transistor and the second on voltage is at a load transistor threshold voltage, and the programming voltage is positive, whereby the bit is changed to a second resistivity level.

7. The method of claim 6, wherein the second resistivity level is a high resistance state.

8. The method of claim 6, wherein the second resistivity level is a low resistance state.

9. A method of reading a bit having multiple resistivity states within a memory array comprising the steps of:

providing the bit formed at the cross point of a word line and a bit line with a perovskite active layer interposed between the word line and the bit line, wherein the bit line is connected through a bit pass transistor, having a bit pass gate, to an inverter, with a load transistor, having a load gate, connected between the inverter and ground;

applying a readout voltage to the word line;

applying an on voltage to the bit pass gate, whereby current is allowed to flow through the bit pass transistor;

applying a load voltage to the load gate, whereby current above a saturation current of the load transistor is allowed to flow through the load transistor, and current below the saturation current will not flow through the load transistor; and reading an output voltage from the inverter.

10. The method of claim 9, wherein the bit is in a low resistance state, whereby a current, which is higher than the saturation current of the load transistor, flows through the bit, and the bit pass transistor, and the load transistor to ground, such that the output voltage of the inverter is approximately zero volts.

11. The method of claim 9, wherein the bit is in a high resistance state, whereby a current, which is lower than the saturation current of the load transistor, flows through the bit, and the bit pass transistor, but does not flows through the load transistor, such that the output voltage of the inverter is approximately the readout voltage.

* * * * *